(12) United States Patent
Wang et al.

(10) Patent No.: US 8,589,773 B1
(45) Date of Patent: **\*Nov. 19, 2013**

(54) DISK DRIVE MARGINING READ CHANNEL BY BIASING LOG-LIKELIHOOD RATIOS OF AN ITERATIVE DECODER

(75) Inventors: Alvin J. Wang, Fremont, CA (US); Patrick J. Lee, San Jose, CA (US); Manmohan K. Sharma, Cupertino, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 572 days.

This patent is subject to a terminal disclaimer.

(21) Appl. No.: 12/641,899

(22) Filed: Dec. 18, 2009

(51) Int. Cl.
  *H03M 13/03*  (2006.01)
(52) U.S. Cl.
  USPC ........................................................ 714/794
(58) Field of Classification Search
  USPC .................................. 714/795, 794
  See application file for complete search history.

(56) References Cited

U.S. PATENT DOCUMENTS

| | | | |
|---|---|---|---|
| 5,786,951 A | 7/1998 | Welland et al. | |
| 6,731,443 B2 * | 5/2004 | Bliss et al. | 360/46 |
| 6,771,442 B2 | 8/2004 | Bliss et al. | |
| 7,372,651 B2 | 5/2008 | Gunderson et al. | |
| 7,555,071 B2 | 6/2009 | Sontowski | |
| 7,606,300 B2 | 10/2009 | Lim | |
| 8,339,919 B1 | 12/2012 | Lee | |
| 2007/0071140 A1 * | 3/2007 | Sontowski | 375/341 |
| 2009/0086855 A1 * | 4/2009 | Jin et al. | 375/341 |
| 2009/0147890 A1 * | 6/2009 | Lee et al. | 375/341 |

OTHER PUBLICATIONS

Jeruchim, et. al., "Simulation of Communication Systems", Plenum Press, New York, 1992, pp. 496-505.
Notice of Allowance dated Nov. 8, 2012 from U.S. Appl. No. 13/325,309, 19 pages.

* cited by examiner

*Primary Examiner* — Michael Maskulinski
*Assistant Examiner* — Neil Miles

(57) ABSTRACT

A disk drive is disclosed comprising a head actuated over a disk comprising a plurality of data tracks. A read signal emanating from the head is sampled to generate read samples, and first log-likelihood ratios (LLRs) are generated in response to the read samples. The first LLRs are biased to generate biased LLRs, and the biased LLRs are decoded into a data sequence, wherein the biased LLRs increase an error rate of the data sequence.

22 Claims, 5 Drawing Sheets

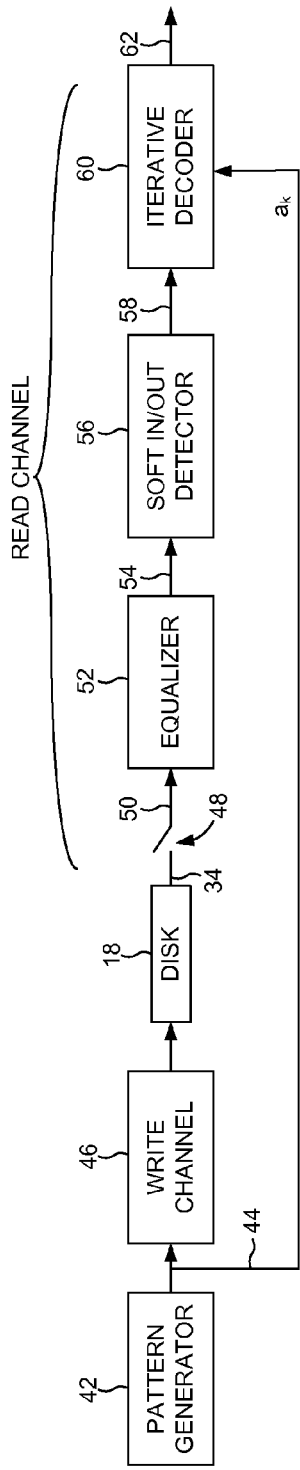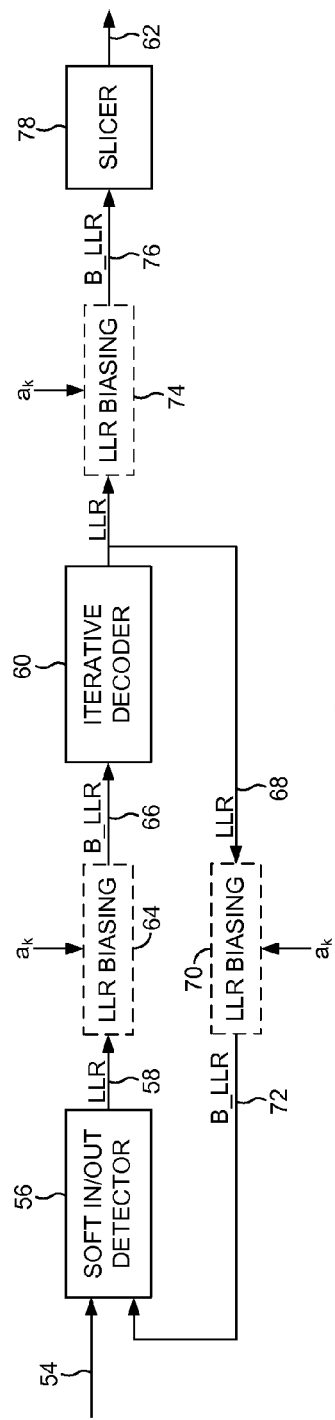
FIG. 3A
FIG. 3B
$B\_LLR_k = c \cdot LLR_k - a_k \cdot m$
FIG. 3C
$B\_LLR_k = MODIFIED\_HISTOGRAM[LLR_k]$
FIG. 3D

DISK DRIVE MARGINING READ CHANNEL BY BIASING LOG-LIKELIHOOD RATIOS OF AN ITERATIVE DECODER

BACKGROUND

Disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the velocity of the actuator arm as it seeks from track to track.

FIG. 1 shows a prior art disk format 2 comprising a plurality of data tracks 4 defined by a number of servo sectors $6_0$-$6_N$ recorded around the circumference of each data track. Each servo sector 6, comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a track address, used to position the head over a target data track during a seek operation. Each servo sector 6, further comprises groups of servo bursts 14 (e.g., A, B, C and D bursts), which comprise a number of consecutive transitions recorded at precise intervals and offsets with respect to a data track centerline. The groups of servo bursts 14 provide fine head position information used for centerline tracking while accessing a data track during write/read operations.

When reading data from the disk, a read channel typically samples the read signal to generate sample values that are equalized into a target response (e.g., a target partial response). A sequence detector detects an estimated data sequence from the equalized samples, and errors in the estimated data sequence are corrected, for example, using an iterative decoder such as a Turbo Code decoder, Low Density Parity Check (LDPC) decoder, or any suitable message passing decoder (a.k.a. belief propagation decoder).

It is desirable to measure the performance of the disk drive in terms of bit error rate in order to qualify each disk drive as acceptable and/or calibrate various parameters of each disk drive (e.g., by selecting a data density or calibrating read channel parameters). Since the bit error rate of an iterative decoder is typically very low, it is desirable to margin the read channel in order to expedite the qualification and/or the calibration procedures.

BRIEF DESCRIPTION OF THE DRAWINGS

FIG. 3A shows control circuitry according to an embodiment of the present invention including a soft in/out sequence detector and an iterative decoder.

FIG. 3B shows control circuitry according to an embodiment of the present invention including various points where the LLRs may be biased.

FIG. 3C shows an equation according to an embodiment of the present invention for biasing the LLRs.

FIG. 3D shows an embodiment of the present invention wherein the LLRs are biased in response to a histogram of the LLRs.

DETAILED DESCRIPTION OF EMBODIMENTS OF THE INVENTION

Figure 1:
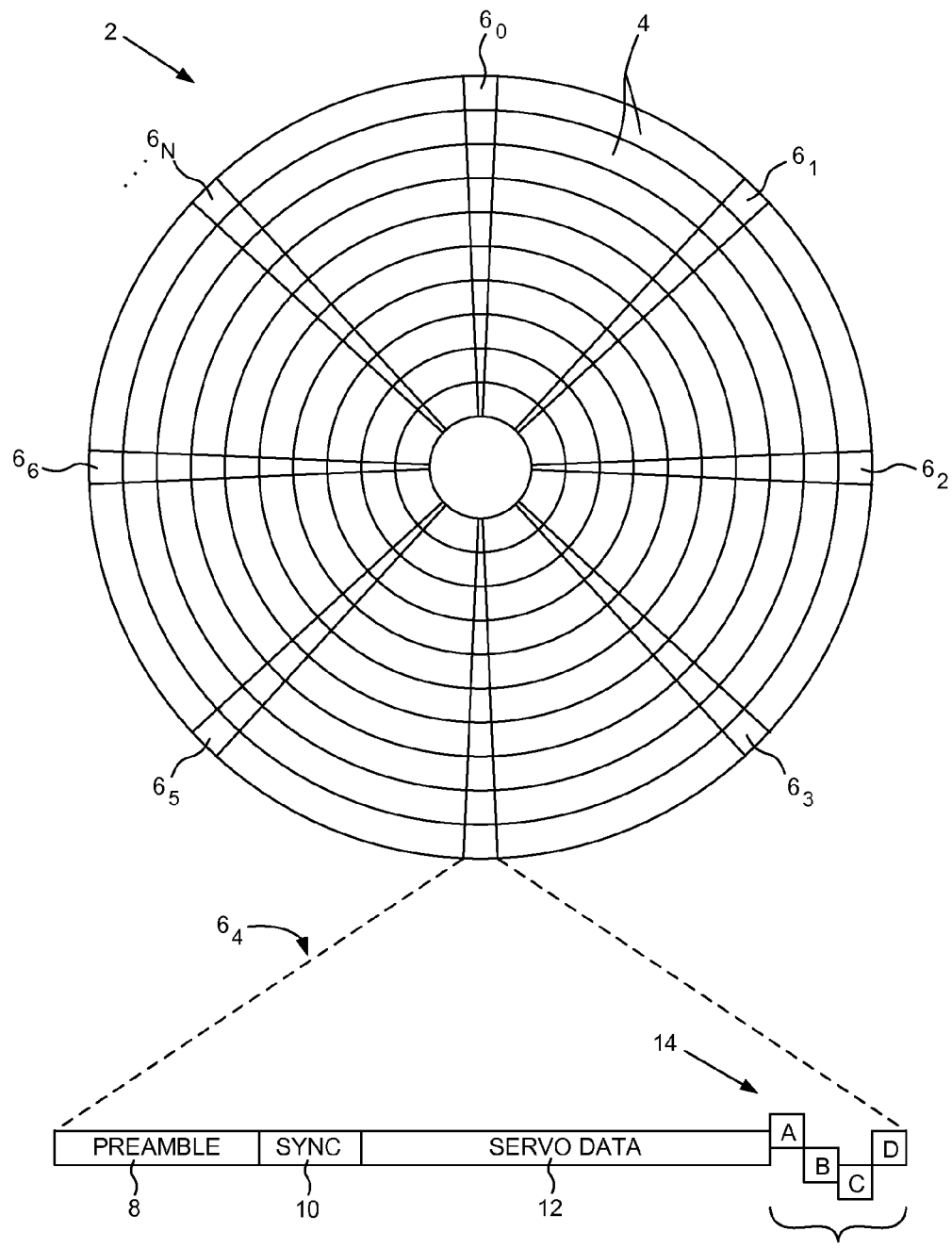
FIG. 1 shows a prior art disk format comprising a plurality of data tracks defined by embedded servo sectors.
Figures 2A, 2B:
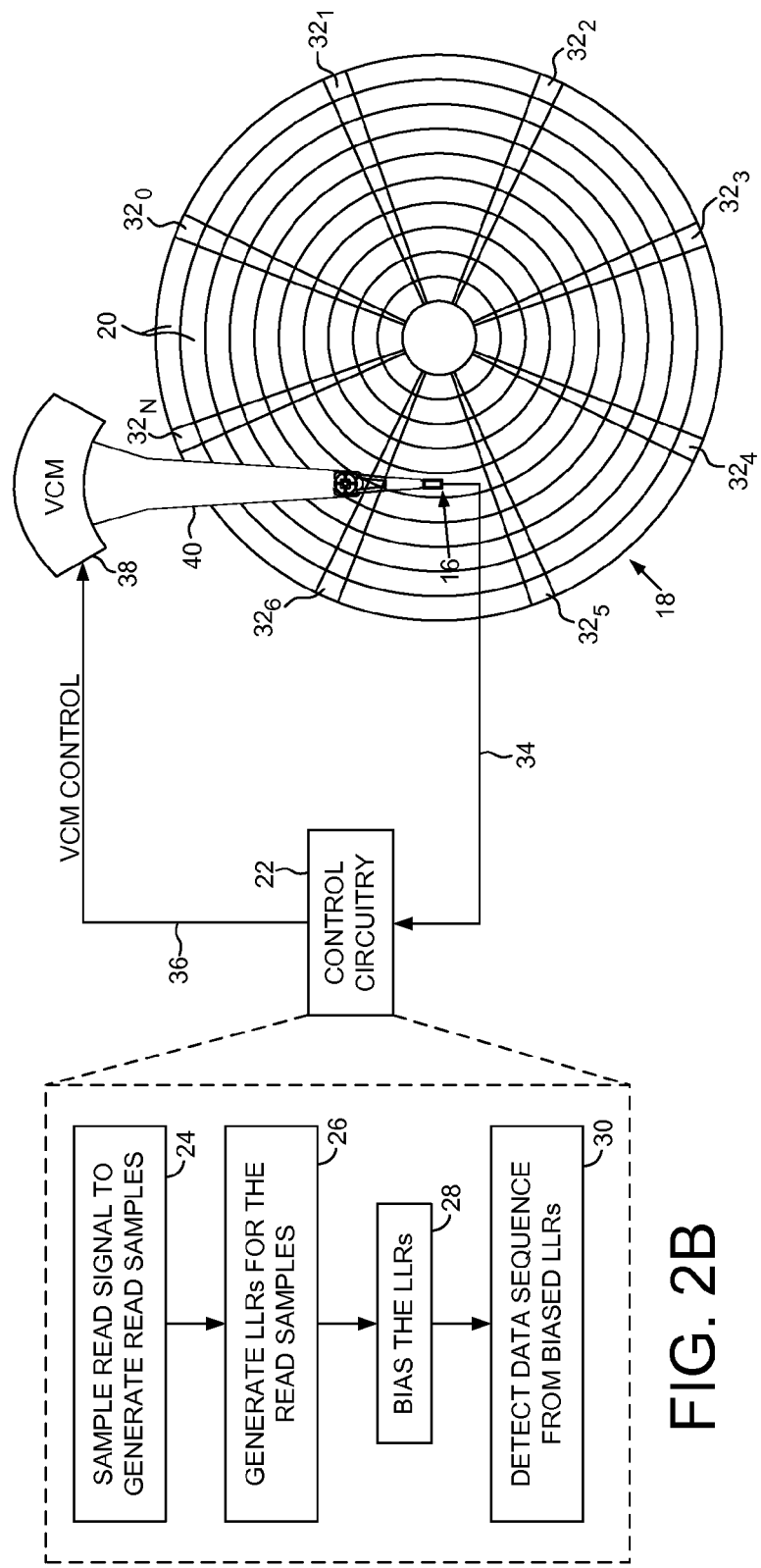
FIG. 2A shows a disk drive according to an embodiment of the present invention comprising a head actuated over a disk, and control circuitry.
FIG. 2B is a flow diagram executed by the control circuitry wherein log-likelihood ratios (LLRs) are biased to increase the bit error rate, and thereby facilitate qualifying and/or calibrating the disk drive according to an embodiment of the present invention.

FIG. 2A shows a disk drive according to an embodiment of the present invention comprising a head 16 actuated over a disk 18 comprising a plurality of data tracks 20. The disk drive further comprises control circuitry 22 operable to execute the flow diagram of FIG. 2B wherein a read signal emanating from the head is sampled to generate read samples (step 24), and a first log-likelihood ratio (LLR) is generated corresponding to each read sample (step 26). The first LLRs are biased to generate biased LLRs (step 28), and the biased LLRs are decoded into a data sequence (step 30), wherein the biased LLRs increase a bit error rate of the data sequence.

In the embodiment of FIG. 2A, the disk 18 comprises a plurality of servo sectors $32_0$-$32_N$ that define the plurality of data tracks 20. The control circuitry 22 processes the read signal 34 to demodulate the servo sectors $32_0$-$32_N$ into a position error signal (PES). The PES is filtered with a suitable compensation filter to generate a control signal 36 applied to a voice coil motor (VCM) 38 which rotates an actuator arm 40 about a pivot in order to position the head 16 radially over the disk 18 in a direction that reduces the PES. The servo sectors $32_0$-$32_N$ may comprise any suitable position information, such as a track address for coarse positioning and servo bursts for fine positioning.

FIG. 3A shows control circuitry according to an embodiment of the present invention comprising a pattern generator 42 operable to generate a test pattern 44 that is written to the disk 18 through a write channel 46 which modulates a write current in a write element (e.g., an inductive write element). During read back, the test pattern 44 is read from the disk 18 to generate a read signal 34 that is sampled 48 to generate read samples 50. The read samples 50 are equalized 52 according to a target response (e.g., partial response), and the equalized samples 54 processed by a soft in/out sequence detector 56. The soft in/out sequence detector 56 generates a sequence of log-likelihood ratios (LLRs) 58 representing a likelihood that each equalized sample 54 corresponds to a symbol in the test pattern 44. The LLRs 58 are processed by an iterative decoder 60 executing a suitable message passing algorithm which further resolves the LLRs and then makes a decision on which symbol each LLR represents. The resulting data sequence 62 may be processed using additional error detection and correction circuitry (e.g., a Reed-Solomon code) before the data sequence 62 is transmitted to the host.

The data detection algorithms in the read channel of FIG. 3A are typically very accurate making it difficult to qualify and/or calibrate the components of the disk drive by measuring a bit error rate. That is, without margining the read channel it may take an unacceptable long period of time to generate a meaningful bit error rate that can be used to qualify and/or calibrate the disk drive. Accordingly, in an embodiment of the present invention the LLRs processed to detect the data sequence are biased in order to margin the read channel while qualifying and/or calibrating the disk drive.

FIG. 3B shows control circuitry according to an embodiment of the present invention for biasing the LLRs. The LLRs may be biased at any suitable point along the read channel path, and in one embodiment the LLRs may be biased at multiple points. In the embodiment shown in FIG. 3B, the LLRs 58 generated by the soft in/out sequence detector 56 may be biased 64 to generate biased LLRs 66 input into the iterative decoder 60. Additionally, or alternatively, the LLRs 68 generated by the iterative decoder 60 may be biased 70 to generate biased LLRs 72 that are fed back to the input of the soft in/out sequence detector 56. Additionally, or alternatively, the LLRs 68 generated by the iterative decoder 60 may be biased 74 to generate biased LLRs 76 input into a slicer 78, wherein the slicer 78 may make a binary decision as to the symbol each biased LLR 76 represents (e.g., +1 or −1).

In one embodiment, the soft in/out sequence detector executes a suitable sequence detection algorithm, such as a suitable soft in/out Viterbi algorithm or a suitable Maximum A Posteriori (MAP) algorithm. In addition, in one embodiment the iterative decoder 60 executes a suitable message passing algorithm (a.k.a., belief propagation algorithm) which performs a series of local iterations for generating and updating LLRs for each node of a graph structure (e.g., in a LDPC code). In one embodiment, the LLRs generated during the local iterations of the iterative decoder may be biased (not shown) to margin the detection algorithm. Although not required, FIG. 3B also illustrates an embodiment wherein the LLRs 68 generated by the iterative decoder 60 are passed back to the soft in/out sequence detector 56 in order to perform global iterations on the LLRs.

Figure 4A:
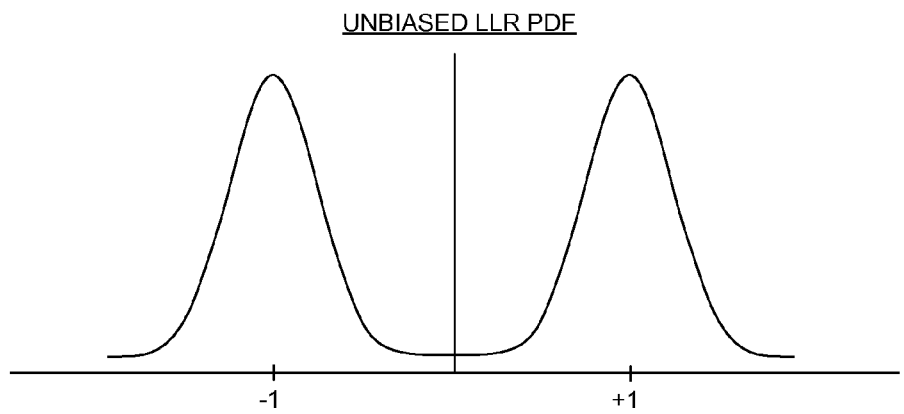
FIG. 4A shows an unbiased probability distribution function (PDF) for the LLRs.
Figure 4B:
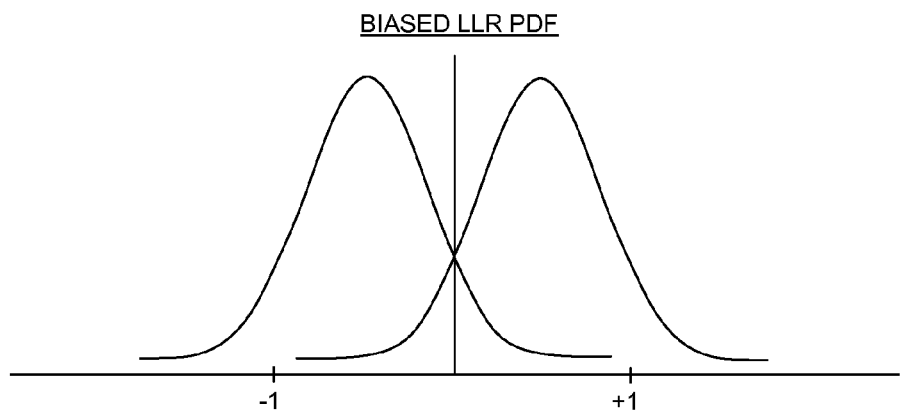
FIG. 4B shows a modified PDF after biasing the LLRs using an equation according to an embodiment of the present invention.

Since the soft in/out sequence detector 56 and iterative decoder 60 operate according to probabilistic algorithms, in one embodiment these algorithms are margined by modifying the probability distribution function (PDF) of the LLRs. FIG. 4A shows an example LLR PDF according to an embodiment of the present invention wherein each symbol in the test pattern 44 is selected from the set {+1,−1}. The PDF for the LLRs representing each symbol comprises a mean and a variance. An error occurs when an LLR of a corresponding symbol crosses over a decision boundary of the PDF representing a different symbol. Most errors occur near the decision boundary, and since an unbiased PDF typically has very few LLRs near the decision boundary, the bit error rate of an unbiased system is typically very low. In order to margin the control circuitry, in one embodiment the LLRs are biased in order to modify the corresponding LLR PDF so as to increase the bit error rate of the detection algorithms. An example modified LLR PDF is shown in FIG. 4B wherein the mean of each LLR PDF is shifted toward each other, and the variance of each LLR PDF is increased, thereby increasing the number of LLRs that fall near the decision boundary which artificially increases the bit error rate of the detection algorithms to facilitate qualifying and/or calibrating the disk drive.

The LLRs may be biased in any suitable manner in the embodiments of the present invention. FIG. 3C illustrates an embodiment wherein the LLRs are biased using an equation:

$$B\_LLR = c \cdot (LLR_k) - a_k \cdot m$$

where c is a scalar that scales a variance of the LLRs; $a_k$ represents a symbol of the test pattern; and m is a scalar that shifts a mean of the LLRs. As described above, the scalars c and m may be selected so as to shift the means of the LLRs toward each other, as well as to increase the variance of the LLRs thereby increasing the bit error rate of the detection algorithm.

Figure 4C:
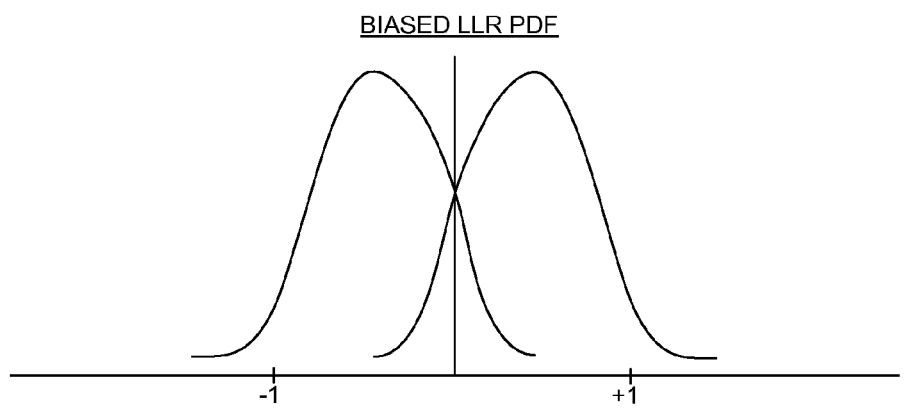
FIG. 4C shows a modified PDF after biasing the LLRs in response to a histogram of the LLRs according to an embodiment of the present invention.

Although the equation shown in FIG. 3C is a linear equation, any suitable non-linear algorithm may be employed to bias the LLRs. For example, in one embodiment a particular target PDF may be determined and then the LLRs modified so as to match the target PDF. FIG. 4C illustrates an example target LLR PDF for each symbol, wherein the variance of each PDF may be increased near the decision boundary in order to increase the bit error rate of the detection algorithms.

In an embodiment shown in FIG. 3D, a target LLR PDF may be achieved by generating a histogram of the biased LLRs and then adjusting each new LLR in response to the histogram. That is, as each new LLR is generated it may be evaluated relative to the current LLR PDF and then biased in a manner that modifies the LLR PDF so as to match a particular target (e.g., as shown in FIG. 4C). In one embodiment, the LLR PDF may be modified to match a target by adapting one or both of the scalars (c and m) in the equation of FIG. 3C as each new LLR is generated (or adapting the scalars before each local or global iteration).

Figure 5:
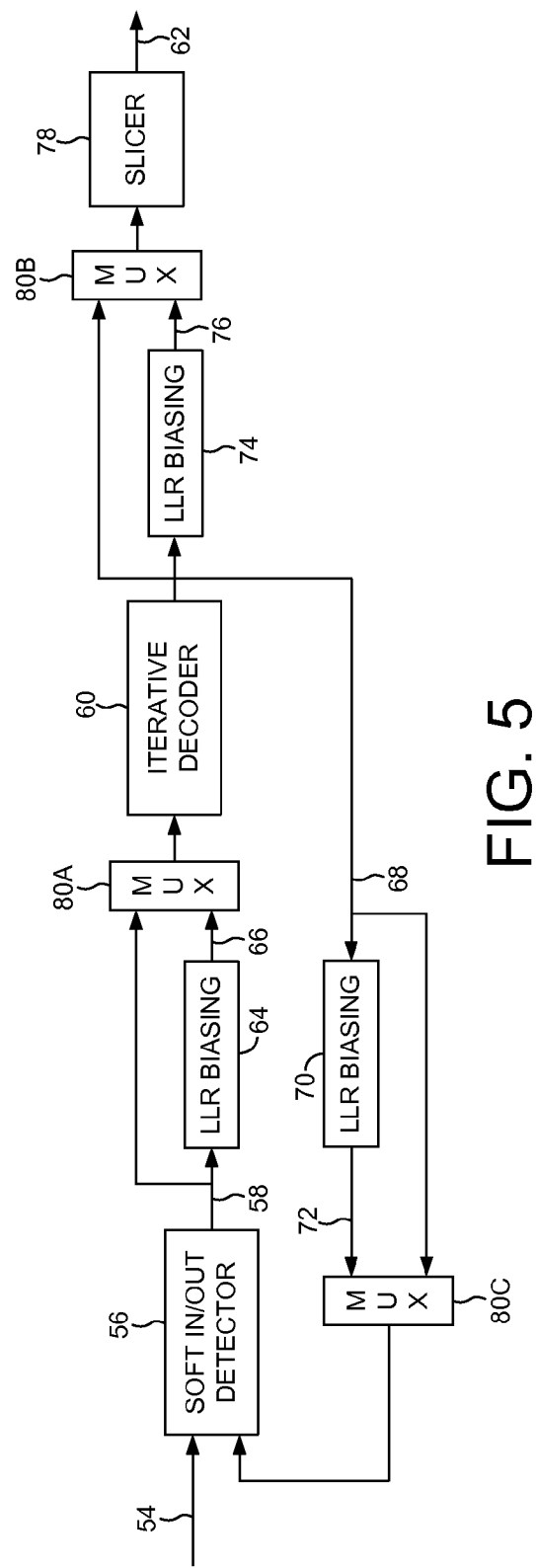
FIG. 5 shows an embodiment of the present invention wherein one or more multiplexers may selectively enable/disable the LLR biasing and in one embodiment, to selectively enable the LLR biasing only during a subset of decoder iterations (global and/or local).

FIG. 5 shows control circuitry according to an embodiment of the present invention comprising a number of multiplexers (e.g., 80A, 80B, 80C) for selectively enabling/disabling the LLR biasing. In one embodiment, the multiplexers may be configured to selectively bias the LLRs only at a particular location within the read channel, or to selectively bias the LLRs at a first location (e.g., 80A) during a first read of the test pattern, and then to selectively bias the LLRs at a second location (e.g., 80C) during a second read of the test pattern. In yet another embodiment, the multiplexers may be configured to bias the LLRs during a subset of the decoder iterations (global and/or local). For example, the multiplexers may be configured to bias the LLRs only during the first global/local iteration, or the first N of M global/local iterations.

Any suitable control circuitry may be employed to implement the flow diagrams in the embodiments of the present invention, such as any suitable integrated circuit or circuits. For example, the control circuitry may be implemented within a read channel integrated circuit, or in a component separate from the read channel, such as a disk controller, or certain steps described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into an SOC.

In one embodiment, the control circuitry comprises a microprocessor executing instructions, the instructions being operable to cause the microprocessor to perform the steps of the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

What is claimed is:

1. A disk drive comprising:
   a disk comprising a plurality of data tracks;
   a head actuated over the disk; and
   control circuitry operable to:
   sample a read signal emanating from the head to generate read samples;
   generate first log-likelihood ratios (LLRs) in response to the read samples;
   bias the first LLRs to generate biased LLRs; and
   decode the biased LLRs into a data sequence, wherein the biased LLRs increase an error rate of the data sequence.

2. The disk drive as recited in claim 1, wherein a sequence detector generates the first LLRs.

3. The disk drive as recited in claim 2, wherein the sequence detector comprises a Viterbi sequence detector.

4. The disk drive as recited in claim 1, wherein the control circuitry is further operable to bias the first LLRs to modify a probability density function (PDF) of the first LLRs.

5. The disk drive as recited in claim 1, wherein the control circuitry is further operable to:
   write a test pattern to the disk;
   read the test pattern from the disk to generate the read signal; and
   bias the first LLRs in response to the test pattern.

6. The disk drive as recited in claim 5, wherein the control circuitry is further operable to bias the first LLRs to modify a probability density function (PDF) of the first LLRs.

7. The disk drive as recited in claim 6, wherein the control circuitry is further operable to bias the first LLRs according to:

$$c \cdot (\text{first LLR}_k) - a_k \cdot m$$

where:
   c is a scalar that scales a variance of the first LLRs;
   $a_k$ represents a symbol of the test pattern; and
   m is a scalar that shifts a mean of the first LLRs.

8. The disk drive as recited in claim 7, wherein biasing the first LLRs modifies the PDF by increasing the variance and shifting the mean toward a center of the PDF.

9. The disk drive as recited in claim 4, wherein the control circuitry is further operable to:
   accumulate the first LLRs into a histogram representing the PDF; and
   generate the biased LLRs in response to the histogram.

10. The disk drive as recited in claim 1, wherein an iterative decoder generates the first LLRs.

11. The disk drive as recited in claim 10, wherein the control circuitry is further operable to bias the first LLRs only during a subset of iterations executed by the iterative decoder.

12. A method of operating a disk drive comprising a head actuated over a disk comprising a plurality of data tracks, the method comprising:
   sampling a read signal emanating from the head to generate read samples;
   generating first log-likelihood ratios (LLRs) in response to the read samples;
   biasing the first LLRs to generate biased LLRs; and
   decoding the biased LLRs into a data sequence, wherein the biased LLRs increase an error rate of the data sequence.

13. The method as recited in claim 12, wherein a sequence detector generates the first LLRs.

14. The method as recited in claim 13, wherein the sequence detector comprises a Viterbi sequence detector.

15. The method as recited in claim 12, further comprising biasing the first LLRs to modify a probability density function (PDF) of the first LLRs.

16. The method as recited in claim 12, further comprising:
   writing a test pattern to the disk;
   reading the test pattern from the disk to generate the read signal; and
   biasing the first LLRs in response to the test pattern.

17. The method as recited in claim 16, further comprising biasing the first LLRs to modify a probability density function (PDF) of the first LLRs.

18. The method as recited in claim 17, wherein the first LLRs are biased according to:

$$c \cdot (\text{first LLR}_k) - a_k \cdot m$$

where:
   c is a scalar that scales a variance of the first LLRs;
   $a_k$ represents a symbol of the test pattern; and
   m is a scalar that shifts a mean of the first LLRs.

19. The method as recited in claim 18, wherein biasing the first LLRs modifies the PDF by increasing the variance and shifting the mean toward a center of the PDF.

20. The method as recited in claim 15, further comprising:
   accumulating the first LLRs into a histogram representing the PDF; and
   generating the biased LLRs in response to the histogram.

21. The method as recited in claim 12, wherein an iterative decoder generates the first LLRs.

22. The method as recited in claim 21, further comprising biasing the first LLRs only during a subset of iterations executed by the iterative decoder.

* * * * *